(12) United States Patent
George et al.

(10) Patent No.: US 12,225,500 B2
(45) Date of Patent: Feb. 11, 2025

(54) SYSTEM AND METHOD FOR TIME-FREQUENCY SEPARATION OF MULTIPLE RADIO SIGNALS

(71) Applicant: Elbit Systems EW And Sigint—Elisra Ltd., Holon (IL)

(72) Inventors: Yaniv George, Holon (IL); Ofer Shariv, Holon (IL); Michael Berkovitch, Holon (IL); Anat Hershko, Holon (IL); Elad Mandelbaum (Mandelbaum), Holon (IL)

(73) Assignee: Elbit Systems EW and Sigint-Elisra Ltd., Holon (IL)

( * ) Notice: Subject to any disclaimer, the term of this patent is extended or adjusted under 35 U.S.C. 154(b) by 0 days.

(21) Appl. No.: 18/427,868

(22) Filed: Jan. 31, 2024

(65) Prior Publication Data

US 2024/0381301 A1     Nov. 14, 2024

Related U.S. Application Data

(63) Continuation of application No. PCT/IL2022/050822, filed on Jul. 28, 2022.

(30) Foreign Application Priority Data

Aug. 1, 2021   (IL) .......................................... 285296

(51) Int. Cl.
*H04W 64/00*     (2009.01)
*G06T 7/11*     (2017.01)
(Continued)

(52) U.S. Cl.
CPC ............. *H04W 64/006* (2013.01); *G06T 7/11* (2017.01); *G06T 7/174* (2017.01); *G06T 11/206* (2013.01);
(Continued)

(58) Field of Classification Search
CPC ....... H04W 64/006; H04W 16/14; G06T 7/11; G06T 7/174; G06T 11/206;
(Continued)

(56) References Cited

U.S. PATENT DOCUMENTS

2010/0332475 A1    12/2010   Birdwell et al.
2014/0079248 A1     3/2014   Short et al.
(Continued)

FOREIGN PATENT DOCUMENTS

CN     103580762 A     2/2014
CN     104158611 A    11/2014
(Continued)

OTHER PUBLICATIONS

Rick Gentile, Honglei Chen, Ethem Sozer, Nov. 20, 2019—Algorithms to Antenna: Train Deep-Learning Networks With Synthesized Radar and Comms Signals. Microwave Journal.
(Continued)

*Primary Examiner* — Ayodeji O Ayotunde
(74) *Attorney, Agent, or Firm* — S.J. Intellectual Property Ltd.

(57) ABSTRACT

A system for time-frequency separation based on image analysis of one or more spectrograms of multiple radio signals received over time from one or more emitters, the system comprising a processing circuitry configured to: determine, using image analysis, a region of at least one of the spectrograms containing representations of a superposition of two or more overlapping radio signals of the radio signals, the overlapping radio signals being representations of radio signals sharing a common time-frequency within the at least one of the spectrograms; decompose the superposition of the two or more overlapping radio signals within the region into separate signal representations, wherein each given separate signal representation of the separate signal
(Continued)

representations is expressed by a corresponding bounding box around the given separate signal representation; and perform, utilizing the separate signal representations, one or more actions.

20 Claims, 7 Drawing Sheets

(51) Int. Cl.
| | |
|---|---|
| *G06T 7/174* | (2017.01) |
| *G06T 11/20* | (2006.01) |
| *H04B 17/27* | (2015.01) |
| *H04B 17/382* | (2015.01) |
| *H04W 16/14* | (2009.01) |

(52) U.S. Cl.
CPC ........... *H04B 17/27* (2015.01); *H04B 17/382* (2015.01); *H04W 16/14* (2013.01); *G06T 2207/20016* (2013.01); *G06T 2207/20072* (2013.01)

(58) Field of Classification Search
CPC ........... G06T 2207/20016; G06T 2207/20072; H04B 17/27; H04B 17/382
USPC ....................................................... 455/67.7
See application file for complete search history.

(56) References Cited

U.S. PATENT DOCUMENTS

| | | | |
|---|---|---|---|
| 2015/0178631 A1 | 6/2015 | Thomas et al. | |
| 2019/0190639 A1 | 6/2019 | Chaffee et al. | |
| 2019/0190693 A1* | 6/2019 | Wetzker | H04W 24/08 |
| 2020/0143279 A1* | 5/2020 | West | G06N 3/08 |
| 2020/0252412 A1 | 8/2020 | Prasad Koppisetti et al. | |

FOREIGN PATENT DOCUMENTS

| | | |
|---|---|---|
| CN | 106353594 A | 1/2017 |
| CN | 110536329 A | 12/2019 |
| CN | 110866448 A | 3/2020 |
| WO | 2016082562 A1 | 6/2016 |

OTHER PUBLICATIONS

Pérez-Romero, J., Sallent, O. and Agusti, R., Apr. 1, 2009—On the Applicability of Image Processing Techniques in the Radio Environment Characterisation. In VTC Spring 2009—IEEE 69th Vehicular Technology Conference (pp. 1-5). IEEE.

Bolea, L., Pérez-Romero, J., Agustí, R. and Sallent, O., May 1, 2010—Image Processing Techniques as a Support to Transmitter Positioning Determination in Cognitive Radio Networks.

Bolea, L., Pérez-Romero, J., Agustí, R. and Sallent, O., Sep. 1, 2009—Primary Transmitter Discovery Based on Image Processing in Cognitive Radio.

O'Shea, T.J., Roy, T. and Clancy, T.C., Dec. 13, 2017—Over-The-Air Deep Learning Based Radio Signal Classification.

Wang, X., Ding, W., Liu, H. and Huang, X., Apr. 18, 2019. Shape recognition through multi-level fusion of features and classifiers. Granular Computing, pp. 1-12—Overlapping signals separation is a difficult problem, where time windowing is unable to separate signals overlapping in time and frequency domain filtering is unable to separate signals with overlapping spectra.

Gorce, J.M., Friboulet, D., Dydenko, I., D'hooge, J., Bijnens, B.H. and Magnin, I.E., Dec. 12, 2002—Processing Radio Frequency Ultrasound Images: A Robust Method for Local Spectral Features Estimation by a Spatially Constrained Parametric Approach.

Peng, S., Jiang, H., Wang, H., Alwageed, H., Zhou, Y., Sebdani, M.M. and Yao, Y.D., Jul. 24, 2018—Modulation Classification Based on Signal Constellation Diagrams and Deep Learning. IEEE transactions on neural networks and learning systems, 30(3), pp. 718-727—Deep learning (DL) is a new machine learning (ML) methodology that has found successful implementations in many application domains.

Al-Oudatallah, J., Abboud, F., Khoury, M. and Ibrahim, H., Jun. 11, 2017. Overlapping Signal Separation Method Using Superresolution Technique Based on Experimental Echo Shape. Advances in Acoustics and Vibration, 2017—Overlapping signals separation is a difficult problem, where time windowing is unable to separate signals overlapping in time and frequency domain filtering is unable to separate signals with overlapping spectra.

Prasad, K. N. R. S. V. et al., "A Deep Learning Framework for Blind Time-Frequency Localization in Wideband Systems," 2020 IEEE 91st Vehicular Technology Conference (VTC2020-Spring), Antwerp, Belgium, 2020, pp. 1-6, doi: 10.1109/VTC2020-Spring48590.2020.9128779.

Prasad, K. N. R. S. V. et al., "A Downscaled Faster-RCNN Framework for Signal Detection and Time-Frequency Localization in Wideband RF Systems," in IEEE Transactions on Wireless Communications, vol. 19, No. 7, pp. 4847-4862, Jul. 2020, doi: 10.1109/TWC.2020.2987990.

\* cited by examiner

SYSTEM AND METHOD FOR TIME-FREQUENCY SEPARATION OF MULTIPLE RADIO SIGNALS

TECHNICAL FIELD

The invention relates to a system and method for time-frequency separation of multiple radio signals received over time from one or more emitters.

BACKGROUND

Wideband Radio Frequency (RF) systems which receive and analyze RF communications in a plurality of frequencies are important in many domains, for example: automotive radar solutions, cellular and Wi-Fi coverage analysis, communication intelligence systems, etc. Current wideband RF analysis utilizes one-dimensional signal processing methods for analyzing energy levels of intercepted RF communications emitted from a plurality of sources and in a plurality of frequencies in order to detect areas within the intercepted RF communications that contain signals of interest to a user of the wideband RF systems. Current wideband RF systems have been designed to handle communication emitted from a limited number of communication sources that are narrowband, have a static or a cyclically changing frequency, have known modulations (e.g., Amplitude Modulation (AM), Frequency Modulation (FM), Frequency Shift Keying (FSK), etc.) and are on a standard grid. Current wideband RF systems are poorly suited to analyze complex RF communication emitted from multiple communication sources that are wideband and that may have an adaptive frequency-hopping spread spectrum communication scheme, such as many modern RF transceivers used in ad-hoc networks. These current wideband RF analysis systems are ill fitted to handle burst communication sources, wideband messages (such as: video feeds, multimedia feeds, etc.), multiple communication sources, sources with advanced modulations and rich communication protocols.

Specifically, current wideband RF systems receive multiple signals from multiple communication sources. These incoming signals can interfere with each other, causing the wideband RF systems to receive a superposed signal. Current wideband RF analysis systems utilizing the one-dimensional signal processing methods for separating the superposed signal into the multiple incoming signals are limited in performance and in separation capabilities.

There is thus a need in the art for a new method and system for wideband RF analysis and specifically for time-frequency separation of one or more spectrograms of multiple radio signals received over time from one or more emitters that may be either unknown, wideband, use burst communications, use complex modulations or have no standard/pre-identified grid.

References considered to be relevant as background to the presently disclosed subject matter are listed below. Acknowledgement of the references herein is not to be inferred as meaning that these are in any way relevant to the patentability of the presently disclosed subject matter.

Patent Corporation Treaty (PCT) application No. 2016/082562 (CHAO et al.) published on Jun. 2, 2016, discloses a signal identification method based on a radio signal spectrum feature template. The method comprises: constructing a signal template library by extracting spectrum features of a plurality of radio signals; preprocessing a signal to be identified according to an expression form of signal templates in the signal template library; comparing and matching the preprocessed signal to be identified with the signal spectrum template library to obtain a type and a spectrum feature parameter of the signal to be identified. The present invention also provides a signal identification system based on a radio signal spectrum feature template, comprising a template construction unit, a preprocessing unit, and a matching unit. In the present invention, the spectrum template can represent various types of signals, the signal identification algorithm is further simplified while ensuring the accuracy of signal identification.

Algorithms to antenna: train deep-learning networks with synthesized radar and comms signals (Gentile et al.) published on Nov. 20, 2019, discloses that modulation identification is an important function for an intelligent receiver. There are numerous applications in cognitive radar, software-defined radio (SDR), and efficient spectrum management. To identify communications and radar waveforms, it's necessary to classify their modulation type. DARPA's Spectrum Collaboration Challenge highlights the need to manage the demand for a shared RF spectrum. Here, we show how you can exploit learning techniques in these types of applications to effectively identify modulation schemes.

On the applicability of image processing techniques in the radio environment characterization (Pérez-Romero et al.) published on April 2009, discloses a novel framework based on image processing techniques for the radio environment characterization. Specifically, after digitalizing a given scenario in accordance with the frequencies that are detected in each point, an image can be built whose pixel intensities capture the radio-electrical conditions. Through non-linear filtering and object detection operations the proposed framework allows identifying the homogeneous regions where certain frequencies can be detected. This methodology can be used in different contexts, such as the construction of databases to provide the terminals with spectrum awareness in flexible spectrum scenarios to facilitate the switch-on procedure or the secondary usage of spectrum, the support to devise proper strategies for cell and RAT selection, etc.

Image processing techniques as a support to transmitter positioning determination in cognitive radio networks (Bolea et al.) published on May 2010, discloses that cognitive radio is a new paradigm for wireless communications offering a solution to conciliate the current spectrum demand growth and underutilization without changes to the existing legacy wireless systems. Secondary users should be able to identify spatial and temporal spectrum holes not occupied by primary users and use them opportunistically, without generating interference to primary receivers. For that purpose, having knowledge of the primary network is required to ensure an appropriate secondary user operation. In this context, and assuming there is no cooperation between primary and secondary networks, this paper proposes a new framework, based on image processing techniques, aimed at combining a number of sensed samples at different geographical positions collected by secondary sensors, in order to estimate the positions of the different primary transmitters. The results can be used to discover frequencies that can be used by a secondary network without disturbing primary receivers. Our results, performed in a realistic scenario, show the efficacy of the proposed framework in estimating transmitter positions.

Chinese Patent application No. 110866448 (HUA et al.) published on Mar. 6, 2020, discloses a flutter signal analysis method based on a convolutional neural network and short-time Fourier transform, which comprises the steps of carrying out time-frequency analysis on actually-measured flutter signals by using the short-time Fourier transform to obtain a time-frequency graph of the flutter signals, then mining image characteristics by using the powerful image processing capacity of the convolutional neural network, and realizing the extraction of the flutter characteristics and the analysis of subsequent signals by calculating through a full connection layer and a loss function. The invention combines the convolution neural network with the short-time Fourier transform of the flutter signal, has good reliability and accuracy for the analysis of the actually measured flutter data, lays a certain foundation for further developing the research of combining artificial intelligence with aeroelasticity, and has practical engineering application value.

GENERAL DESCRIPTION

In accordance with a first aspect of the presently disclosed subject matter, there is provided a system for time-frequency separation based on image analysis of one or more spectrograms of multiple radio signals received over time from one or more emitters, the system comprising a processing circuitry configured to: determine, using image analysis, a region of at least one of the spectrograms containing representations of a superposition of two or more overlapping radio signals of the radio signals, the overlapping radio signals being representations of radio signals sharing a common time-frequency within the at least one of the spectrograms; decompose the superposition of the two or more overlapping radio signals within the region into separate signal representations, wherein each given separate signal representation of the separate signal representations is expressed by a corresponding bounding box around the given separate signal representation; and perform, utilizing the separate signal representations, one or more actions.

In some cases, the processing circuitry is further configured to determine, for at least one separate signal representation of the separate signal representations, one or more parameters based on the corresponding bounding box; and the one or more actions are performed also based on the parameters.

In some cases, the parameters of the separate signal representation include one or more of: (a) wavelength; (b) frequency; (c) rise time; (d) fall time; (e) duration; (f) power; (g) occupied bandwidth; (h) spectral density; (i) activity profile; or (j) polarization.

In some cases, the processing circuitry is further configured to: generate, upon decomposing the superposition of the two or more overlapping radio signals, a plurality of additional spectrograms of the multiple radio signals, wherein: (a) a first additional spectrogram of the additional spectrograms has a first resolution, (b) a second additional spectrogram of the additional spectrograms has a second resolution, and (c) the first resolution is different from the second resolution; and determine, for at least one given separate signal representation of the separate signal representations, one or more fine-tuned parameters of the given separate signal representation utilizing the additional spectrograms and the corresponding parameters, having a better accuracy than an accuracy of the corresponding parameters.

In some cases, the image analysis of the spectrograms of the multiple radio signals received over time is performed continuously or periodically.

In some cases, the processing circuitry is further configured to determine, upon decomposing the superposition of the two or more overlapping radio signals, one or more statistical parameters associated with at least one given separate signal representation of the separate signal representations, based on previous occurrences of the given separate signal representation within the spectrograms.

In some cases, the statistical parameters include one or more of: (a) signal activity level; (b) probability of occurrence; (c) probability of interception; (d) power distribution; (e) frequency stability; or (f) average duration.

In some cases, the actions include one or more of: (a) identify the emitters that emitted the overlapping radio signals; (b) classify the emitters that emitted the overlapping radio signals; (c) generate a compressed representation of the multiple radio signals received over time; (d) extract samples of the overlapping radio signals, thereby enabling radio signal analysis; (e) provide the overlapping radio signals to one or more external systems; or (f) provide the overlapping radio signals to a user of the system.

In some cases, the decomposition of the superposition of the overlapping radio signals is based on Rectilinear Polygon Decomposition (RPD).

In some cases, the decomposition of the superposition of the overlapping radio signals is based on an Artificial Neural Network (ANN).

In some cases, the determination of the region is also based on a band of the multiple radio signals received over time.

In some cases, the region is determined by identifying a bounding box around the region.

In some cases, each of the separate signal representations is expressed by a corresponding bounding box around the separate signal representation.

In some cases, the spectrograms are used to optimize a Signal-to-Nosie (SNR) ratio of the multiple radio signals.

In accordance with a second aspect of the presently disclosed subject matter, there is provided a method for time-frequency separation based on image analysis of one or more spectrograms of multiple radio signals received over time from one or more emitters, the method comprising: determining, by a processing circuitry, using image analysis, a region of at least one of the spectrograms containing representations of a superposition of two or more overlapping radio signals of the radio signals, the overlapping radio signals being representations of radio signals sharing a common time-frequency within the at least one of the spectrograms; decomposing, by the processing circuitry, the superposition of the two or more overlapping radio signals within the region into separate signal representations, wherein each given separate signal representation of the separate signal representations is expressed by a corresponding bounding box around the given separate signal representation; and performing, by the processing circuitry, utilizing the separate signal representations, one or more actions.

In some cases, the method further comprising: determining, by the processing circuitry, for at least one separate signal representation of the separate signal representations, one or more parameters based on the corresponding bounding box; and wherein the one or more actions are performed also based on the parameters In some cases, the parameters of the separate signal representation include one or more of: (a) wavelength; (b) frequency; (c) rise time; (d) fall time; (e) duration; (f) power; (g) occupied bandwidth; (h) spectral density; (i) activity profile; or (j) polarization.

In some cases, method of claim 15, further comprising: generating, by the processing circuitry, upon decomposing the superposition of the two or more overlapping radio signals, a plurality of additional spectrograms of the multiple radio signals, wherein: (a) a first additional spectrogram of the additional spectrograms has a first resolution, (b) a second additional spectrogram of the additional spectrograms has a second resolution, and (c) the first resolution is different from the second resolution; and determining, by the processing circuitry, for at least one given separate signal representation of the separate signal representations, one or more fine-tuned parameters of the given separate signal representation utilizing the additional spectrograms and the corresponding parameters, having a better accuracy than an accuracy of the corresponding parameters.

In some cases, the image analysis of the spectrograms of the multiple radio signals received over time is performed continuously or periodically.

In some cases, the method further comprising determining, upon decomposing the superposition of the two or more overlapping radio signals, one or more statistical parameters associated with at least one given separate signal representation of the separate signal representations, based on previous occurrences of the given separate signal representation within the spectrograms.

In some cases, the statistical parameters include one or more of: (a) signal activity level; (b) probability of occurrence; (c) probability of interception; (d) power distribution; (e) frequency stability; or (f) average duration.

In some cases, the actions include one or more of: (a) identify the emitters that emitted the overlapping radio signals; (b) classify the emitters that emitted the overlapping radio signals; (c) generate a compressed representation of the multiple radio signals received over time; (d) extract samples of the overlapping radio signals, thereby enabling radio signal analysis; (e) provide the overlapping radio signals to one or more external systems; or (f) provide the overlapping radio signals to a user of the system.

In some cases, the decomposition of the superposition of the overlapping radio signals is based on Rectilinear Polygon Decomposition (RPD).

In some cases, the decomposition of the superposition of the overlapping radio signals is based on an Artificial Neural Network (ANN).

In some cases, the determination of the region is also based on a band of the multiple radio signals received over time.

In some cases, the region is determined by identifying a bounding box around the region.

In some cases, each of the separate signal representations is expressed by a corresponding bounding box around the separate signal representation.

In some cases, the spectrograms are used to optimize a Signal-to-Nosie (SNR) ratio of the multiple radio signals.

In accordance with a third aspect of the presently disclosed subject matter, there is provided a non-transitory computer readable storage medium having computer readable program code embodied therewith, the computer readable program code, executable by at least one processing circuitry of a computer to perform a method for time-frequency separation based on image analysis of one or more spectrograms of multiple radio signals received over time from one or more emitters, the method comprising: determining, by a processing circuitry, using image analysis, a region of at least one of the spectrograms containing representations of a superposition of two or more overlapping radio signals of the radio signals, the overlapping radio signals being representations of radio signals sharing a common time-frequency within the at least one of the spectrograms; decompose, by the processing circuitry, the superposition of the two or more overlapping radio signals within the region into separate signal representations, wherein each given separate signal representation of the separate signal representations is expressed by a corresponding bounding box around the given separate signal representation; and perform, by the processing circuitry, utilizing the separate signal representations, one or more actions.

BRIEF DESCRIPTION OF THE DRAWINGS

In order to understand the presently disclosed subject matter and to see how it may be carried out in practice, the subject matter will now be described, by way of non-limiting examples only, with reference to the accompanying drawings, in which.

DETAILED DESCRIPTION

Figure 1A:
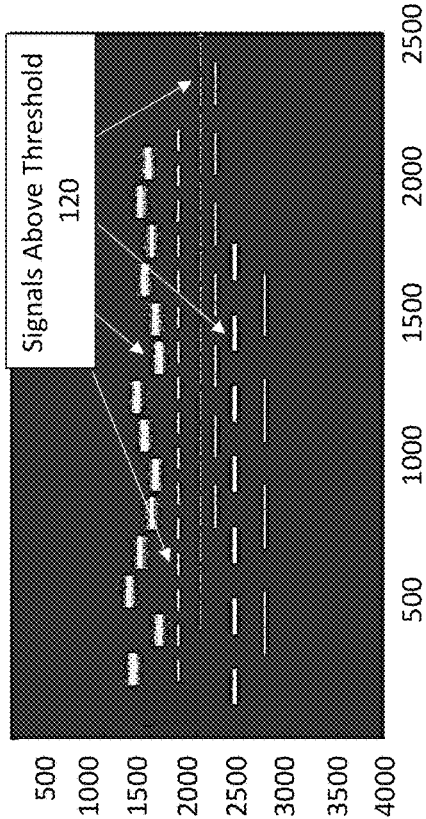
FIG. 1A is a schematic illustration of an example input spectrogram with representations of one or more input signals, in accordance with the presently disclosed subject matter.

In the following detailed description, numerous specific details are set forth in order to provide a thorough understanding of the presently disclosed subject matter. However, it will be understood by those skilled in the art that the presently disclosed subject matter may be practiced without these specific details. In other instances, well-known methods, procedures, and components have not been described in detail so as not to obscure the presently disclosed subject matter.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "determining", "decomposing", "performing", "updating", "separating" or the like, include action and/or processes of a computer that manipulate and/or transform data into other data, said data represented as physical quantities, e.g., such as electronic quantities, and/or said data representing the physical objects. The terms "computer", "processor", "processing resource", "processing circuitry" and "controller" should be expansively construed to cover any kind of electronic device with data processing capabilities, including, by way of non-limiting example, a personal desktop/laptop computer, a server, a computing system, a communication device, a smartphone, a tablet computer, a smart television, a processor (e.g. digital signal processor (DSP), a microcontroller, a field programmable gate array (FPGA), an application specific integrated circuit (ASIC), etc.), a group of multiple physical machines sharing performance of various tasks, virtual servers co-residing on a single physical machine, any other electronic computing device, and/or any combination thereof.

The operations in accordance with the teachings herein may be performed by a computer specially constructed for the desired purposes or by a general-purpose computer specially configured for the desired purpose by a computer program stored in a non-transitory computer readable storage medium. The term "non-transitory" is used herein to exclude transitory, propagating signals, but to otherwise include any volatile or non-volatile computer memory technology suitable to the application.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus, the appearance of the phrase "one case", "some cases", "other cases" or variants thereof does not necessarily refer to the same embodiment(s).

It is appreciated that, unless specifically stated otherwise, certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

Figure 2:
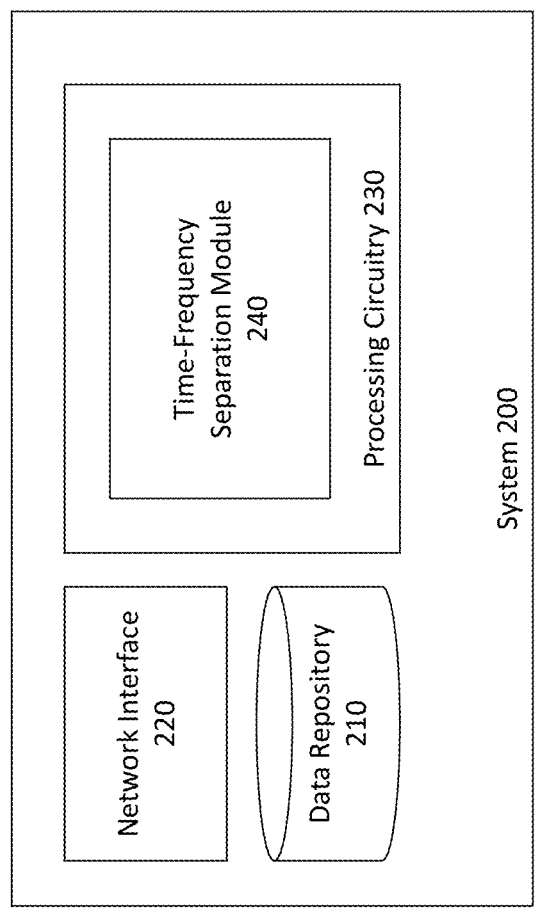
FIG. 2 is a block diagram schematically illustrating one example of a system for time-frequency separation based on image analysis of one or more spectrograms of multiple radio signals received over time from one or more emitters, in accordance with the presently disclosed subject matter.
Figure 3:
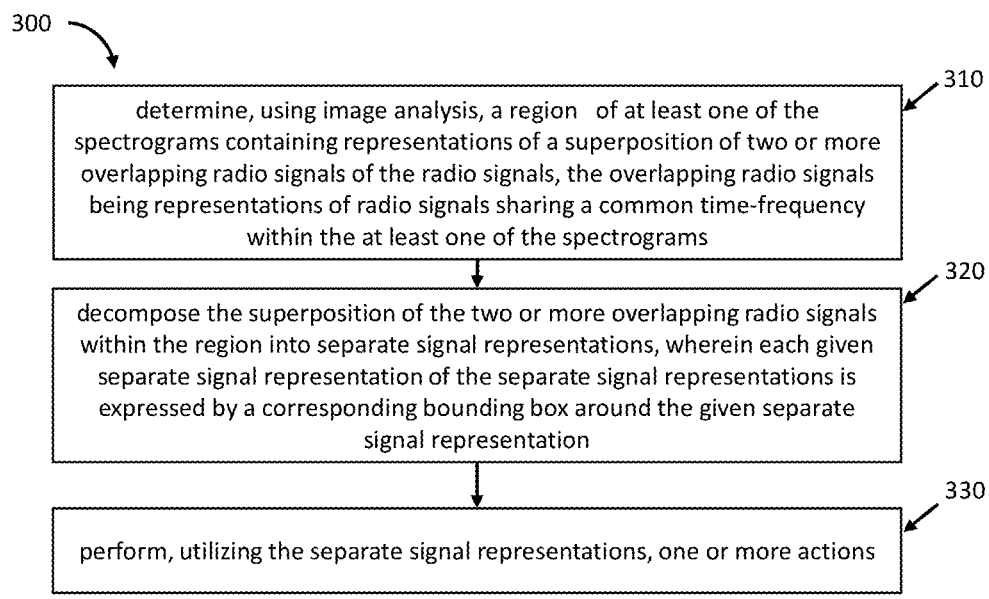
FIG. 3 is a flowchart illustrating one example of a sequence of operations carried out for time-frequency separation based on image analysis of one or more spectrograms of multiple radio signals received over time from one or more emitters, in accordance with the presently disclosed subject matter.

In embodiments of the presently disclosed subject matter, fewer, more and/or different stages than those shown in FIG. 3 may be executed. In embodiments of the presently disclosed subject matter one or more stages illustrated in FIG. 3 may be executed in a different order and/or one or more groups of stages may be executed simultaneously. FIGS. 1A-1D, 2, 4A-4H, 5 illustrate a general schematic of the system components and flows in accordance with an embodiment of the presently disclosed subject matter. Each module and outcome shown in FIGS. 1A-1D, 2, 4A-4H, 5 can be made up of any combination of software, hardware and/or firmware that performs the functions as defined and explained herein. The modules and outcomes shown in FIGS. 1A-1D, 2, 4A-4H, 5 may be centralized in one location or dispersed over more than one location. In other embodiments of the presently disclosed subject matter, the system may comprise fewer, more, and/or different modules than those shown in FIGS. 1A-1D, 2, 4A-4H, 5.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Bearing this in mind, attention is drawn to FIG. 1A, a schematic illustration of an example input spectrogram with representations of one or more input signals, in accordance with the presently disclosed subject matter The input spectrogram is a two-dimensional image representing one or more input signals 110 of intercepted communications. The input spectrogram can be acquired by a wideband receiver, for example a wideband RF receiver (e.g., a spectrum analyzer) that intercepts various RF communications (e.g., radio communication, cellular communication, Wi-Fi communication, radar communication, etc.) emitted by one or more emitters over a period of time. The input spectrogram can be analyzed, utilizing image analysis methods, to detect areas within the intercepted communications that contain signals of interest for a wideband RF analysis system.

The input spectrogram is a graph, where the X axis represents the time of interception (for example: in milliseconds) and the Y axis represents the frequency of interception (for example: in megahertz (MHz)). The color (or the gray scale) of each pixel located at a given X, Y position within the graph is associated with the level of energy (for example: in decibels (dB)) intercepted at time X at frequency Y by the wideband RF receiver. Sequences of the colored pixels can represent input signals 110. For example, FIG. 1A depicts a reoccurring sequenced of bright colored pixel groups located on the Y axis of the graph between pixels 1500 and 2000. These pixel groups represent a reoccurring input signal 110 with a given level of energy (represented by the brightness level of these pixels) that was intercepted between pixels 1500 and 2000.

Figure 1B:
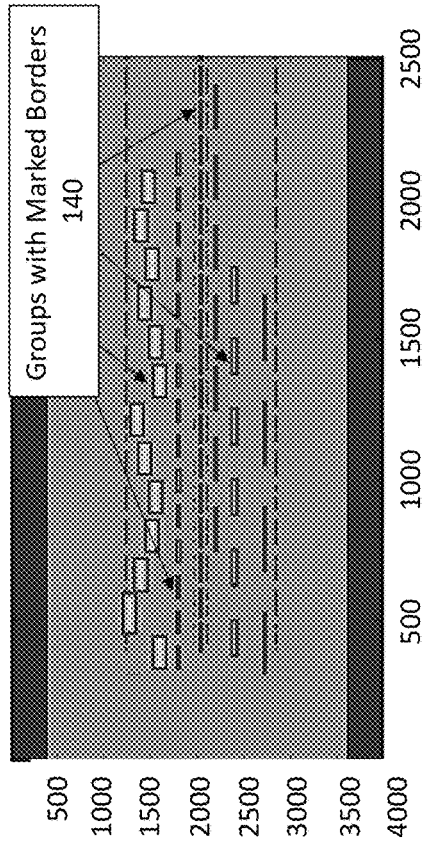
FIG. 1B is a schematic illustration of an example spectrogram with representations of one or more signals of the input signals that are above a threshold, in accordance with the presently disclosed subject matter.

The wideband RF analysis system can optionally process the input spectrogram to create a filtered intercepted communications image, a non-limiting example of which is presented in FIG. 1B. A pixel of the filtered intercepted communications image located in given X, Y position is in an "on state" if the color of a corresponding given pixel located at the given X, Y position of the input spectrogram is above a color threshold (for example: above a color representing −40 dBm). If the corresponding given pixel of the input spectrogram is below the color threshold than it will be in an "off state" in the filtered intercepted communications image and will not be part of any additional processing steps, as detailed herein. The pixels remaining in an "on state" represent signals above a threshold 120. In the non-limiting example of FIG. 1B, an input signal of the input signals 110 that is located at pixel 1500 at the beginning of the X axis, which is below the color threshold, is removed and is not part of the above a threshold signals 120.

Similarly, the wideband RF analysis system can optionally process the filtered intercepted communications image to create a noise-filtered intercepted communications image to eliminate pixels that are above a noise threshold. The noise threshold may be determined for each spectrogram according to a desired sensitivity target. The filtering stages enable the wideband RF analysis system to process only the parts of the input spectrogram which have signals above a threshold signals 120 and are noise filtered signals thereby providing better results for identifying signals within the input spectrogram.

Figure 1C:
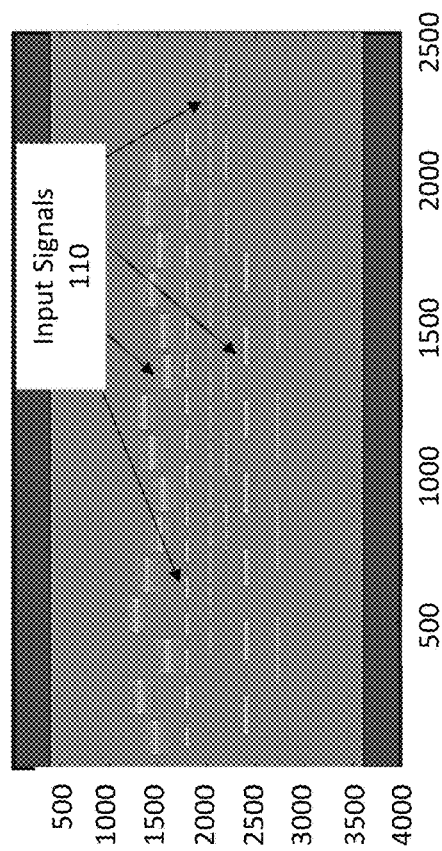
FIG. 1C is a schematic illustration of an example spectrogram with representations of one or more identified groups of pixels, in accordance with the presently disclosed subject matter.

The wideband RF analysis system processes the above a threshold signals communications image utilizing a local distance grouping algorithm (for example: a labeling algorithm that labels connected components in 2-D binary image) to detect groups of pixels within the filtered intercepted communications image. The wideband RF analysis system can also optionally filter out pixels that are not found by the local distance grouping algorithm to be part of any group of pixels. Each identified group of the identified groups 130 of pixels can represent an identified signal within the intercepted communications on which the system can perform one or more actions, for example: identifying overlapping radio signals that are represented by a group of pixels embodying two or more overlapping radio signals represented as two or more sub-groups of the identified group, as further detailed herein, inter alia with reference to FIGS. 4A-4H. A non-limiting example of the resulting processed image is depicted in FIG. 1C.

Figure 1D:
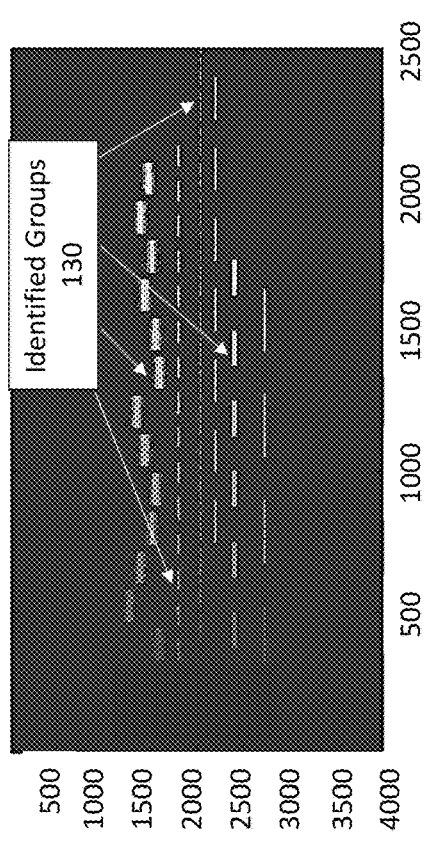
FIG. 1D is a schematic illustration of an example spectrogram with representations of one or more groups with marked borders, in accordance with the presently disclosed subject matter.

FIG. 1D is a non-limiting example of marking the identified groups 130 with borders, thereby giving raise to groups with marked borders 140 being the pixels identified as groups with borders around them marking each of the groups of pixels individually. It is noted that this phase of the processing can optionally use the filtered intercepted communications image or the input spectrogram itself. In addition, the described system can determine one or more parameters of the identified signals, such as: wavelength, frequency, polarization, etc.

Having briefly described an example input spectrogram and the processing of the input spectrogram to identify one or more identified signals 140, attention is drawn to FIG. 2, a block diagram schematically illustrating one example of a system for time-frequency separation based on image analysis of one or more spectrograms of multiple radio signals received over time from one or more emitters, in accordance with the presently disclosed subject matter.

System 200 can comprise or be otherwise associated with a data repository 210 (e.g., a database, a storage system, a memory including Read Only Memory—ROM, Random Access Memory—RAM, or any other type of memory, etc.) configured to store data, including, inter alia, input spectrograms, filtered intercepted communications images, noise-filtered intercepted communications images, processed images, thresholds, properties of the identifies signals 140, etc. In some cases, data repository 210 can be further configured to enable retrieval and/or update and/or deletion of the data stored thereon. It is to be noted that in some cases, data repository 210 can be distributed. It is to be noted that in some cases, data repository 210 can be stored in on cloud-based storage.

System 200 can further comprise a network interface 220 enabling connecting the system 200 to a network and enabling it to send and receive data sent thereto through the network, including in some cases receiving one or more spectrograms representing RF signals acquired over time, for example: from a wideband RF receiver. In a non-limiting sample setup, system 200 can analyze in real-time spectrograms representing a 40 MHz spectrum that includes multiple emitters (some of them can be burst communication emitters and/or frequency hopping emitters) emitting hundreds of signals per second. In some cases, the network interface 220 can be connected to a Local Area Network (LAN), to a Wide Area Network (WAN), or to the Internet. In some cases, the network interface 220 can connect to a wireless network.

System 200 further comprises processing circuitry 230. Processing circuitry 230 can be one or more processing circuitry units (e.g., central processing units), microprocessors, microcontrollers (e.g., microcontroller units (MCUs)) or any other computing devices or modules, including multiple and/or parallel and/or distributed processing circuitry units, which are adapted to independently or cooperatively process data for controlling relevant system 200 resources and for enabling operations related to system 200 resources.

The processing circuitry 230 comprises the following module: time-frequency separation module 240.

Time-frequency separation module 240 can be configured to perform a time-frequency separation process, as further detailed herein, inter alia with reference to FIG. 3.

FIG. 3 is a flowchart illustrating one example of a sequence of operations carried out for time-frequency separation based on image analysis of one or more spectrograms of multiple radio signals received over time from one or more emitters, in accordance with the presently disclosed subject matter.

Figure 4A:
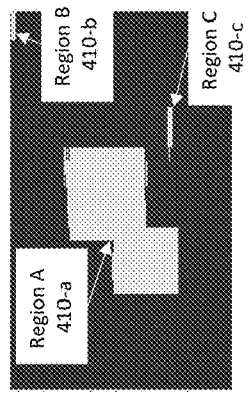
FIGS. 4A-4H are schematic illustrations of exemplary regions within a spectrogram with representations of one or more overlapping signals, in accordance with the presently disclosed subject matter.

According to certain examples of the presently disclosed subject matter, system 200 can be configured to perform a time-frequency separation process 300, e.g., utilizing the time-frequency separation module 240, for the identification and decomposition of overlapping radio signals represented within the input spectrogram. Overlapping radio signals can be acquired by the wideband RF receiver when two or more emitters emit radio signals at the same time within overlapping frequencies. The overlapping radio signals are represented by a region of the input spectrogram as a group of pixels embodying the two or more overlapping radio signals. FIG. 4A is a schematic illustration of an exemplary region (e.g., one of: region A 410-*a*, region B 410-*b*, or region C 410-*c*) within the input spectrogram which represent one or more overlapping signals, in accordance with the presently disclosed subject matter. System 200 analyses at least one of the regions to determine if it contains a superposition representation of the overlapping radio signals and decomposes the overlapped signals into separate signal representations. For this purpose, system 200 can be configured to determine, using image analysis, a region (e.g., one of: region A 410-*a*, region B 410-*b*, or region C 410-*c*) of at least one of the spectrograms containing representations of a superposition of two or more overlapping radio signals of the radio signals, the overlapping radio signals being representations of radio signals sharing a common time-frequency within the at least one of the spectrograms (block 310). System 200 analyses the input spectrogram to determine at least one region (e.g., one of: region A 410-*a*, region B 410-*b*, or region C 410-*c*) within it. The determination of the region can be achieved by using a machine learning model (e.g., an Artificial Neural Network (ANN), a random forest, a decision tree, etc.) that masks all pixels that are associated with an object representing a non-overlapping radio signal or by any other image analysis technique. The determination of the region (e.g., one of: region A 410-*a*, region B 410-*b*, or region C 410-*c*) can be also based on a band (e.g., High Frequency (HF) band, Very High Frequency (VHF) band, Ultra High Frequency (UHF) band, etc.) of the multiple radio signals received over time and represented within the input spectrogram.

It is noted that the region (e.g., one of: region A 410-*a*, region B 410-*b*, or region C 410-*c*) can be one or more groups of pixels from one or more areas within the input spectrogram, these areas can be non-consecutive areas of the input spectrogram. For example: one region (e.g., one of: region A 410-*a*, region B 410-*b*, or region C 410-*c*) can include a group of pixels from an upper left corner of the input spectrogram and a group of pixels from a lower right corner of the input spectrogram.

After determining the region (e.g., one or more of: region A 410-*a*, region B 410-*b*, or region C 410-*c*), system 200 can be further configured to decompose the superposition of the two or more overlapping radio signals within the region (e.g., one or more of: region A 410-*a*, region B 410-*b*, or region C 410-*c*) into separate signal representations, wherein each given separate signal representation of the separate signal representations is expressed by a corresponding bounding box around the given separate signal representation (block 320). System 200 decomposes the superposition of the two or more overlapping radio signals within the region (e.g., one or more of: region A 410-*a*, region B 410-*b*, or region C 410-*c*) by employing one or more decomposition algorithms (e.g., Rectilinear Polygon Decomposition (RPD), etc.) and/or by using one or more machine learning modules (e.g., an Artificial Neural Network (ANN), a random forest, a decision tree, etc.) trained to decompose the superposition of the two or more overlapping radio signals into separate signal representations.

System 200 determines and draws a bounding box around at least one of the separated signal representations. The bounding box describes the signal's boundaries in the time and in the frequency domains. The bounding box marks the location of the separated signal within the spectrogram. These bounding boxes express the separated signal representations and can be utilized, together with the spectrogram, to extract additional information about the serrated signal to determine one or more parameters of the separated signal. This is performed by analyzing the corresponding bounding boxes themselves, for example, by analyzing the location in X and Y axis of the bounding box, the shape of the bounding box, the color of the bounding box, the size of the bounding box, etc. The parameters that can be deduced from analyzing the bounding box include: wavelength of the corresponding separated signal, frequency of the corresponding separated signal, rise time of the corresponding separated signal, fall time of the corresponding separated signal, duration of the corresponding separated signal, power of the corresponding separated signal, occupied bandwidth of the corresponding separated signal, spectral density of the corresponding separated signal, activity profile of the corresponding separated signal, polarization of the corresponding separated signal, and more.

Figure 6:
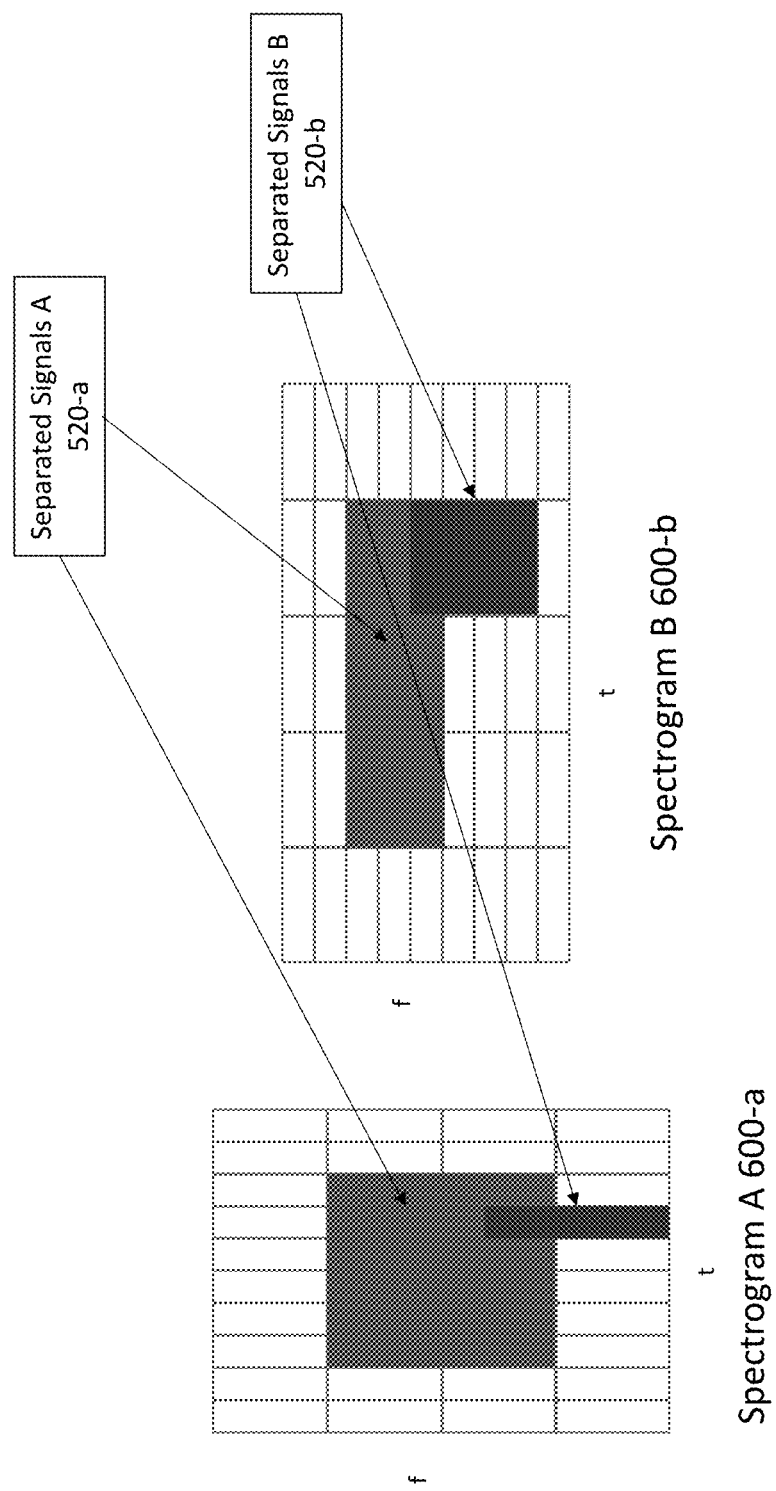
FIG. 6 is a schematic illustration of an example spectrogram with a fine time resolution with representations of two exemplary separated signals and an example spectrogram with a fine frequency resolution with representations of the two exemplary separated signals, in accordance with the presently disclosed subject matter.

In some cases, system 200 can fine tune the generated parameters of the separated signals. System 200 archives this by applying a multi-resolution time-frequency analysis method. This allows system 200 to further increase the accuracy and resolution of the bounding boxes around the separated signals and to deduce more accurate estimation of the parameters. In the multi-resolution analysis, system 200 generates multiple additional spectrograms of the same received multiple radio signals used for the spectrogram wherein the separated signal representations and their bounding boxes have been identified. These additional spectrograms can have different resolutions. The additional spectrograms are used to deduce accurate signal parameters estimation and to fine tune the parameters. As it is not theoretically possible to capture accurately both the time and the frequency properties of a signal using a single spectrogram due to limitations posed by the Gabor uncertainty principle, when analyzing a signal using a single spectrogram there is tradeoff between fine time resolution representation of the signal and fine frequency resolution representation of the same signal. System 200 generates both fine time resolution representation additional spectrogram and fine frequency resolution representation additional spectrogram and utilizes them to fine tune the parameters deduced from the bounding boxes of the separated signals. The additional spectrograms resolution depends on signal duration and bandwidth, and are generated to provide optimal accuracy in the time and in the frequency domain alternately. Thus, parameters that are associated with the time domain are extract from high time resolution additional spectrograms, and parameters associated with the frequency domain are extract from high frequency resolution additional spectrograms. Estimation and fine tuning of the signal time and frequency parameters can be done separately, by analyzing the separated signal's bounding box in the time domain and the signal's spectral power envelope in the frequency domain. FIG. 6 is a non-limiting example of additional spectrograms generated by system 200: spectrogram A 600-*a* has fine time resolution. Separated signals A 520-*a* are decomposed by system 200 and corresponding bounding boxes are drawn around them. System 200 also generates, for the same received radio signals the exemplary spectrogram depicted in spectrogram B 600-*b*, depicting an additional spectrogram with a fine frequency resolution. The same separated signals from spectrogram A 600-*a* are depicted also in spectrogram B 600-*b* as separated signals B 520-*b*. Take note that the properties (for example: the location, the shape, etc.) of the separated signals B 520-*b* and their corresponding bounding boxes are different in the fine frequency resolution spectrogram because of the different resolution, thus fine-tuned parameters that are related to frequency can be deduced from this spectrogram. In a same way, system 200 can fine tune time related parameters by using the additional spectrogram that has a fine time resolution depicted in spectrogram A 600-*a*.

In some cases, system 200 can detect the radio signal representations within the spectrograms by continuously of periodically processing a sequence of input spectrograms frame-by-frame. As the multiple radio signals are received over a given time period, their representations can appear in one or more spectrograms that are generated continuously of periodically over the given time period. System 200 can detect the same signal, having a similar bounding box or a changing bounding box between the sequence of spectrograms. The signal bounding boxes can be processed on a frame-by-frame basis to deduce statistical and temporal parameters. The statistical and temporal parameters can be extracted on the detected signal. Such information can include: signal activity level, probability of occurrence and interception, power distribution, frequency stability average duration and more. System 200 can continuously process the signal representations for each incoming spectrogram. System 200 can perform periodical processing for at least some of the spectrograms.

Figure 4B:
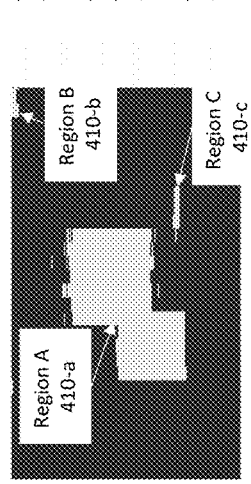

A non-limiting example of the superposition of the two or more overlapping radio signals includes the following steps, while noting that at least some of the steps are optional:

Down-sampling the input representation—system 200 process the region (e.g., one or more of: region A 410-*a*, region B 410-*b*, or region C 410-*c*) within the input spectrogram, as depicted in FIG. 4A to create a down-sampled spectrogram, an example thereof is depicted in FIG. 4B. The down-sampling can be achieved by using a sample-based discretization process, for example: max-pooling. The down-sampling can improve the Signal-to-Nosie (SNR) ratio in the resulting down-sampled spectrogram.

Figure 4C:
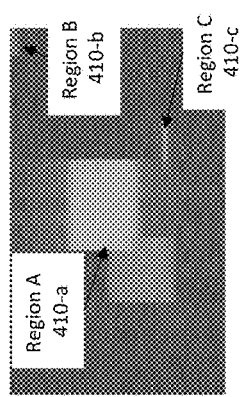

Threshold filtering—system 200 process the region (e.g., one or more of: region A 410-*a*, region B 410-*b*, or region C 410-*c*) within the down sampled spectrogram, as depicted in FIG. 4B to create a threshold-filtered spectrogram, an example thereof is depicted in FIG. 4C. The threshold-filtered spectrogram can include only pixels having a color above a color threshold (for example: above a color representing −40 dB). If the corresponding given pixel of the input spectrogram is below the color threshold than it will be in an "off state" in the threshold-filtered spectrogram. System 200 may utilize the pixels that are below the color threshold in the succeeding processing steps. These pixels may be used as "off state" pixels. In some cases, the below the color threshold pixels can be used for image closing, for example: by filling holes in "on state" pixel groups.

Figure 4D:
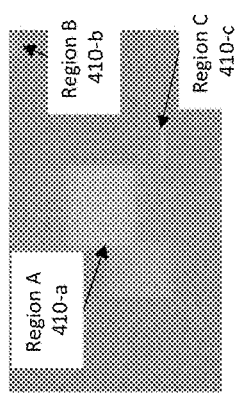

Noise filtering—system 200 process the region (e.g., one or more of: region A 410-*a*, region B 410-*b*, or region C 410-*c*) within the threshold-filtered spectrogram, as depicted in FIG. 4C to create a noise-filtered spectrogram, an example thereof is depicted in FIG. 4D.

Figure 4E:
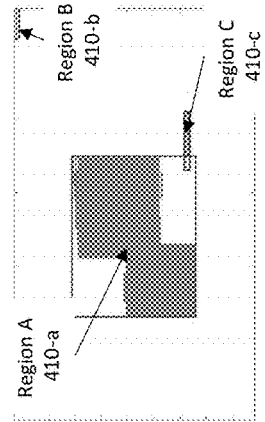

Object recognition—system 200 process the region (e.g., one or more of: region A 410-*a*, region B 410-*b*, or region C 410-*c*) within the noise-filtered spectrogram, as depicted in FIG. 4D to create an object-recognition spectrogram, an example thereof is depicted in FIG. 4E. The object-recognition can be achieved, for example, by utilizing a labeling algorithm that labels connected components in the noise-filtered spectrogram to detect objects—which are consecutive groups of pixels making up the region (e.g., one or more of: region A 410-*a*, region B 410-*b*, or region C 410-*c*).

Figure 4F:
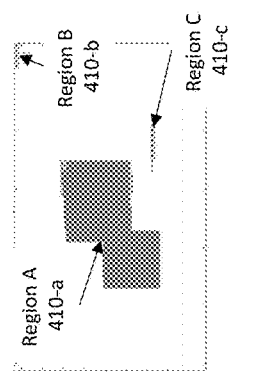
Figure 4H:
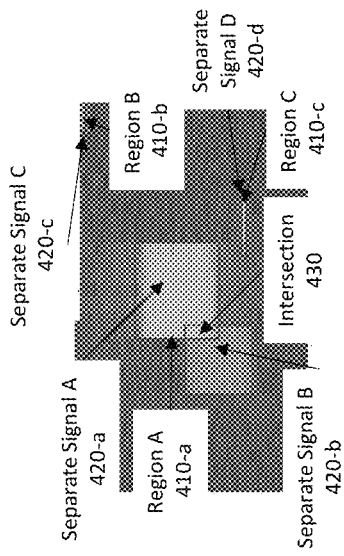
Figure 4G:
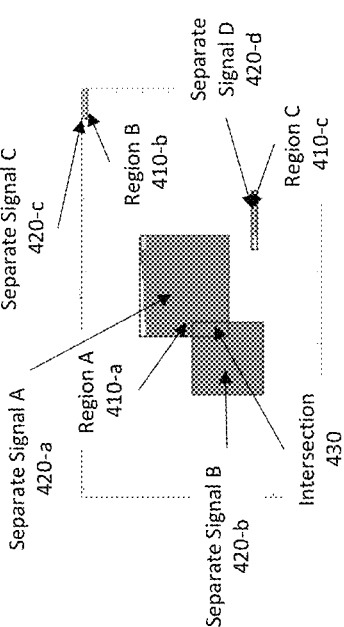

Overlapping object recognition—system 200 process the region (e.g., one or more of: region A 410-*a*, region B 410-*b*, or region C 410-*c*) within the object-recognition spectrogram, as depicted in FIG. 4E to create an overlapping object-recognition spectrogram, an example thereof is depicted in FIG. 4F, wherein the region is determined by identifying a bounding box around the region. This can be achieved for example by drawing a tangential polygon containing each of the identified objects. In regions (e.g., one or more of: region A 410-*a*, region B 410-*b*, or region C 410-*c*) with overlapping signals—the tangential polygons will separate the overlapping signals into separate signal representations as depicted, for example, in FIGS. 4G and 4H, wherein each of the separate signal representations is expressed by a corresponding bounding box around the separate signal representation. In FIG. 4H the separate signal representations are depicted on the background of the input spectrogram representation. In our non-limiting example depicted in FIGS. 4G and 4H, the regions: region A 410-*a*, region B 410-*b*, and region C 410-*c*, have been separated into separate signals: separate signal A 420-*a*, separate signal B 420-*b*, separate signal C 420-*c* and separate signal D 420-*d*.

Figure 5:
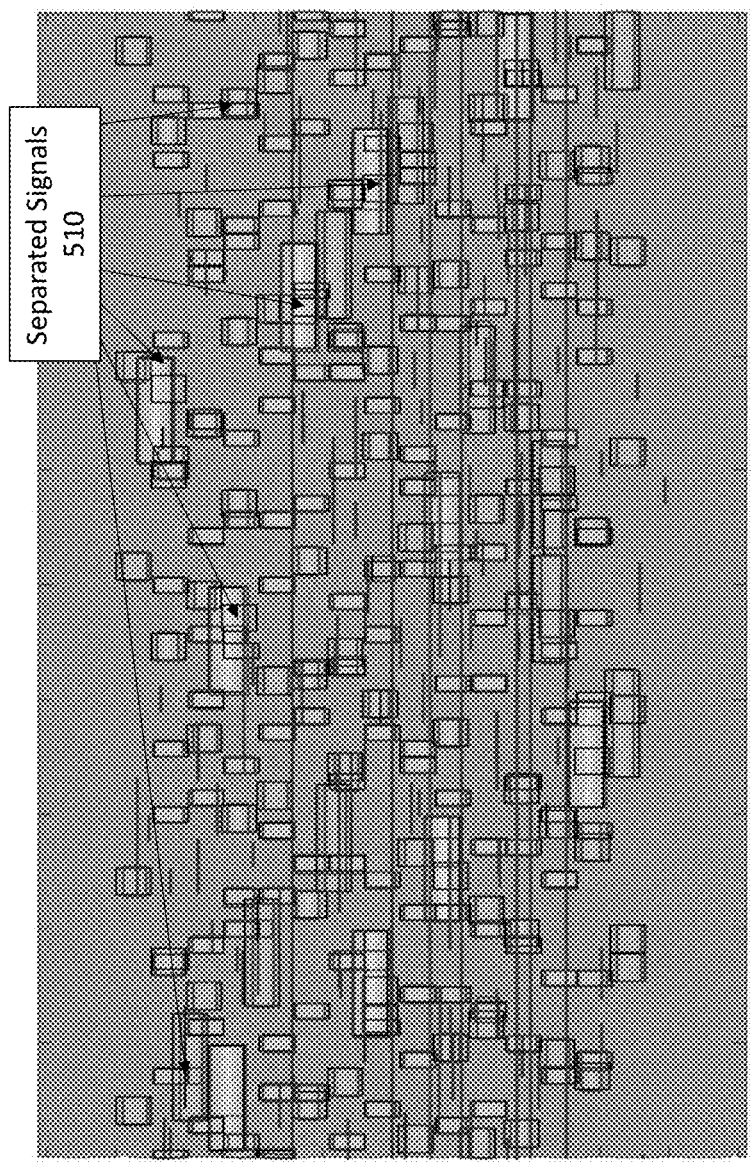
FIG. 5 is a schematic illustration of an example spectrogram with representations of one or more separated signals, in accordance with the presently disclosed subject matter.

It is to be noted, that in some cases the overlapping objects have one or more intersections 430, wherein each intersection 430 is an area of the objects that is common to two or more objects. In our example intersection 430 is common to separate signal A 420-*a* and separate signal B 420-*b*. System 200 can identify intersection 430 and associate it to each of the objects it belongs to. The bounding boxes can be overlaid on all the regions of an input spectrogram as depicted in FIG. 5.

System 200 can also use the input spectrogram to optimize a Signal-to-Nosie (SNR) ratio of the separate signal representation.

In addition, System 200 can employ pattern recognition techniques to determine if the input spectrogram includes frequency hopping signals.

System 200 can then be configured to perform, utilizing the separate signal representations (e.g., one or more of: separate signal A 420-*a*, separate signal B 420-*b*, separate signal C 420-*c*, or separate signal D 420-*d*), one or more actions (block 330). It is to be noted that the actions can be based also on the parameters deduced from the bounding box in block 320 and on the fine-tuned parameters determined using the multi-resolution spectrograms generated by system 200 in block 320.

The actions can include one or more of:

identify the emitters that emitted the overlapping radio signals—system 200 can have an identifier for each emitter and each of the separated signals (e.g., one or more of: separate signal A 420-*a*, separate signal B 420-*b*, separate signal C 420-*c*, or separate signal D 420-*d*) are associated with a different identified emitter.

classify the emitters that emitted the overlapping radio signals—system 200 can utilize the parameters of the separated signals (e.g., one or more of: separate signal A 420-*a*, separate signal B 420-*b*, separate signal C 420-*c*, or separate signal D 420-*d*) to classify the emitter in accordance with the emitted band. For example: an HF emitter, a VHF emitter, a UHF emitter, etc.

generate a compressed representation of the multiple radio signals received over time.

extract samples of the overlapping radio signals, thereby enabling radio signal analysis of: positioning one or more of the overlapping radio signals, detection of one or more of the overlapping radio signals, or precise parameters estimation of one or more of the overlapping radio signals.

provide the separated signals (e.g., one or more of: separate signal A 420-*a*, separate signal B 420-*b*, separate signal C 420-*c*, or separate signal D 420-*d*) to one or more external systems—such as: to a cellular coverage planner, radio frequency usage monitoring systems, etc.

provide the separated signals (e.g., one or more of: separate signal A 420-*a*, separate signal B 420-*b*, separate signal C 420-*c*, or separate signal D 420-*d*) to a user of the system 200, for example by utilizing a User Interface (UI) component of system 200.

In some cases, the separated signals, their corresponding bounding boxes and parameters can be used by different signal analysis algorithms and applications, internal or external to system 200, including: Spectrum Monitoring, Cognitive Radio Spectrum Sensing, Signals Classification and Clustering, Communication Signals Demodulation and Data Extraction, Signals Direction Finding and Geolocation and other algorithms and applications.

It is to be noted that, with reference to FIG. 3, some of the blocks can be integrated into a consolidated block or can be broken down to a few blocks and/or other blocks may be added. Furthermore, in some cases, the blocks can be performed in a different order than described herein. It is to be further noted that some of the blocks are optional. It should be also noted that whilst the flow diagram is described also with reference to the system elements that realizes them, this is by no means binding, and the blocks can be performed by elements other than those described herein.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

The invention claimed is:

1. A system for time-frequency separation based on image analysis of one or more spectrograms of multiple radio signals received over time from one or more emitters, the system comprising a processing circuitry configured to:
   determine, using image analysis, a region of at least one of the spectrograms containing representations of a superposition of two or more overlapping radio signals of the radio signals, the overlapping radio signals being representations of radio signals sharing a common time-frequency within the at least one of the spectrograms;
   decompose the superposition of the two or more overlapping radio signals within the region into separate signal representations, wherein each given separate signal representation of the separate signal representations is expressed by a corresponding bounding box around the given separate signal representation;
   determine, for at least one separate signal representation of the separate signal representations, one or more parameters based on the corresponding bounding box; and
   perform, utilizing the separate signal representations and the parameters, one or more actions.

2. The system of claim 1, wherein the parameters of the separate signal representation include one or more of:
   (a) wavelength;
   (b) frequency;
   (c) rise time;
   (d) fall time;
   (e) duration;
   (f) power;
   (g) occupied bandwidth;
   (h) spectral density;
   (i) activity profile; or
   (j) polarization.

3. The system of claim 1, wherein the processing circuitry is further configured to:
   generate, upon decomposing the superposition of the two or more overlapping radio signals, a plurality of additional spectrograms of the multiple radio signals, wherein: (a) a first additional spectrogram of the additional spectrograms has a first resolution, (b) a second additional spectrogram of the additional spectrograms has a second resolution, and (c) the first resolution is different from the second resolution; and
   determine, for at least one given separate signal representation of the separate signal representations, one or more fine-tuned parameters of the given separate signal representation utilizing the additional spectrograms and the corresponding parameters, having a better accuracy than an accuracy of the corresponding parameters.

4. The system of claim 1, wherein the image analysis of the spectrograms of the multiple radio signals received over time is performed continuously or periodically.

5. The system of claim 4, wherein the processing circuitry is further configured to determine, upon decomposing the superposition of the two or more overlapping radio signals, one or more statistical parameters associated with at least one given separate signal representation of the separate signal representations, based on previous occurrences of the given separate signal representation within the spectrograms.

6. The system of claim 5, wherein the statistical parameters include one or more of:
   (a) signal activity level;
   (b) probability of occurrence;
   (c) probability of interception;
   (d) power distribution;
   (e) frequency stability; or
   (f) average durations.

7. The system of claim 1, wherein the actions include one or more of:
   (a) identify the emitters that emitted the overlapping radio signals;
   (b) classify the emitters that emitted the overlapping radio signals;
   (c) generate a compressed representation of the multiple radio signals received over time;
   (d) extract samples of the overlapping radio signals, thereby enabling radio signal analysis;
   (e) provide the overlapping radio signals to one or more external systems; or
   (f) provide the overlapping radio signals to a user of the system.

8. The system of claim 1, wherein the decomposition of the superposition of the overlapping radio signals is based on Rectilinear Polygon Decomposition (RPD).

9. The system of claim 1, wherein the determination of the region is also based on a band of the multiple radio signals received over time.

10. The system of claim 1, wherein the region is determined by identifying a bounding box around the region.

11. A method for time-frequency separation based on image analysis of one or more spectrograms of multiple radio signals received over time from one or more emitters, the method comprising:
   determining, by a processing circuitry, using image analysis, a region of at least one of the spectrograms containing representations of a superposition of two or more overlapping radio signals of the radio signals, the overlapping radio signals being representations of radio signals sharing a common time-frequency within the at least one of the spectrograms;

decomposing, by the processing circuitry, the superposition of the two or more overlapping radio signals within the region into separate signal representations, wherein each given separate signal representation of the separate signal representations is expressed by a corresponding bounding box around the given separate signal representation;

determining, for at least one separate signal representation of the separate signal representations, one or more parameters based on the corresponding bounding box; and performing, by the processing circuitry, utilizing the separate signal representations and the parameters, one or more actions.

12. The method of claim 11, wherein the parameters of the separate signal representation include one or more of:
(a) wavelength;
(b) frequency;
(c) rise time;
(d) fall time;
(e) duration;
(f) power;
(g) occupied bandwidth;
(h) spectral density;
(i) activity profile; or
(j) polarization.

13. The method of claim 11, further comprising:
generating, by the processing circuitry, upon decomposing the superposition of the two or more overlapping radio signals, a plurality of additional spectrograms of the multiple radio signals, wherein: (a) a first additional spectrogram of the additional spectrograms has a first resolution, (b) a second additional spectrogram of the additional spectrograms has a second resolution, and (c) the first resolution is different from the second resolution; and determining, by the processing circuitry, for at least one given separate signal representation of the separate signal representations, one or more fine-tuned parameters of the given separate signal representation utilizing the additional spectrograms and the corresponding parameters, having a better accuracy than an accuracy of the corresponding parameters.

14. The method of claim 11, wherein the image analysis of the spectrograms of the multiple radio signals received over time is performed continuously or periodically.

15. The method of claim 14, further comprising determining, upon decomposing the superposition of the two or more overlapping radio signals, one or more statistical parameters associated with at least one given separate signal representation of the separate signal representations, based on previous occurrences of the given separate signal representation within the spectrograms.

16. The method of claim 15, wherein the statistical parameters include one or more of:
(a) signal activity level;
(b) probability of occurrence;
(c) probability of interception;
(d) power distribution;
(e) frequency stability; or
(f) average duration.

17. The method of claim 11, wherein the actions include one or more of:
(a) identify the emitters that emitted the overlapping radio signals;
(b) classify the emitters that emitted the overlapping radio signals;
(c) generate a compressed representation of the multiple radio signals received over time;
(d) extract samples of the overlapping radio signals, thereby enabling radio signal analysis;
(e) provide the overlapping radio signals to one or more external systems; or
(f) provide the overlapping radio signals to a user of the system.

18. The method of claim 11, wherein the determination of the region is also based on a band of the multiple radio signals received over time.

19. The method of claim 11, wherein the region is determined by identifying a bounding box around the region.

20. A non-transitory computer readable storage medium having computer readable program code embodied therewith, the computer readable program code, executable by at least one processing circuitry of a computer to perform a method for time-frequency separation based on image analysis of one or more spectrograms of multiple radio signals received over time from one or more emitters, the method comprising:

determining, by a processing circuitry, using image analysis, a region of at least one of the spectrograms containing representations of a superposition of two or more overlapping radio signals of the radio signals, the overlapping radio signals being representations of radio signals sharing a common time-frequency within the at least one of the spectrograms;

decompose, by the processing circuitry, the superposition of the two or more overlapping radio signals within the region into separate signal representations, wherein each given separate signal representation of the separate signal representations is expressed by a corresponding bounding box around the given separate signal representation;

determining, for at least one separate signal representation of the separate signal representations, one or more parameters based on the corresponding bounding box; and perform, by the processing circuitry, utilizing the separate signal representations and the parameters, one or more actions.

* * * * *